(12) United States Patent
Kim

(10) Patent No.: US 7,589,410 B2
(45) Date of Patent: Sep. 15, 2009

(54) MOLDED RECONFIGURED WAFER, STACK PACKAGE USING THE SAME, AND METHOD FOR MANUFACTURING THE STACK PACKAGE

(75) Inventor: Jong Hoon Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/777,643

(22) Filed: Jul. 13, 2007

(65) Prior Publication Data

US 2008/0308921 A1 Dec. 18, 2008

(30) Foreign Application Priority Data

Jun. 18, 2007 (KR) .................. 10-2007-0059315

(51) Int. Cl.
*H01L 23/538* (2006.01)
(52) U.S. Cl. .................. 257/686; 257/774; 257/777; 257/786; 257/E23.011; 257/E23.068; 257/E23.142; 257/E23.169
(58) Field of Classification Search .................. 257/777, 257/774, 686, 786, E23.011, E23.068, E23.142, 257/E26.169
See application file for complete search history.

(56) References Cited

U.S. PATENT DOCUMENTS

| 7,215,033 | B2 * | 5/2007 | Lee et al. ............... 257/777 |
| 2008/0136004 | A1 * | 6/2008 | Yang et al. .............. 257/686 |
| 2008/0318363 | A1 * | 12/2008 | Kwon et al. ............. 438/113 |

FOREIGN PATENT DOCUMENTS

| KR | 1020050021078 | 3/2005 | |
| KR | 1020050021078 A | * 3/2005 | ............ 23/48 |

OTHER PUBLICATIONS

M. Brunnbauer, et al; "An Embedded Device Technology Based on a Molded Reconfigured Wafer", 2006 IEEE Electronic Components and Technology Conference, pp. 547-551.

* cited by examiner

*Primary Examiner*—Victor A Mandala
(74) *Attorney, Agent, or Firm*—Ladas & Parry LLP

(57) ABSTRACT

A stack package includes at least two stacked package units. Each package unit comprises semiconductor chips having bonding pads on upper surfaces thereof; a molding part formed to surround side surfaces of the semiconductor chips; through-electrodes formed in the molding part; and re-distribution lines formed to connect the through-electrodes and adjacent bonding pads with each other.

15 Claims, 7 Drawing Sheets

Molded reconfigured wafer

US 7,589,410 B2

MOLDED RECONFIGURED WAFER, STACK PACKAGE USING THE SAME, AND METHOD FOR MANUFACTURING THE STACK PACKAGE

CROSS-REFERENCE TO RELATED APPLICATIONS

The present application claims priority to Korean patent application number 10-2007-0059315 filed on Jun. 18, 2007, which is incorporated herein by reference in its entirety.

BACKGROUND OF THE INVENTION

The present invention relates to a stack package, and more particularly to a molded reconfigured wafer which simplifies the manufacturing process and decreases manufacturing costs, a stack package using the same, and a method for manufacturing the stack package.

Packaging technology for a semiconductor integrated device has continuously been developed to allow for miniaturization and high capacity. Recently, various techniques for stack packages capable of satisfying the demand toward miniaturization, high capacity and mounting efficiency have been developed.

The term "stack" as used in the semiconductor industry means to vertically place at least two semiconductor chips or packages. Stack technology, in the case of a memory device, it is possible to realize a product having a larger memory capacity that which is obtainable through a semiconductor integration process as well as an increased efficiency in usage of the mounting area.

Depending upon the manufacturing technology, stack packages are divided into a first type, in which individual semiconductor chips are stacked and the stacked semiconductor chips are packaged together at once, and a second type in which individual, separately packaged semiconductor chips are stacked. The stack packages use metal wires or through-silicon vias to electrically connect semiconductor chips to one another.

FIG. 1 is a cross-sectional view illustrating a conventional stack package using metal wires.

Referring to FIG. 1, in a stack package 100 using metal wires, at least two semiconductor chips 110 are stacked on a substrate 120 by adhesives 114. The respective chips 110 and the substrate 120 are electrically connected to each other by metal wires 116.

In FIG. 1, the unexplained reference numeral 112 designates bonding pads, 122 connection pads, 124 ball lands, 126 circuit wirings, 170 outside connection terminals, and 190 an encapsulant.

However, in the conventional stack package using the metal wires, since electrical signals are transmitted through the metal wires, signal exchange speed is slow, and since a number of metal wires are used, the electrical characteristics of the respective chips are likely to deteriorate. Further, because an additional area is required in the substrate to form the metal wires, the size of the package increases, and because a gap is required to bond the metal wires to the bonding pads, the overall height of the package increases.

Therefore, in order to overcome the problems caused in the stack package using the metal wires, prevent the electrical characteristics of the stack package from deteriorating and enable miniaturization of the stack package, a stack package using through-silicon vias has been suggested in the art.

FIG. 2 is a cross-sectional view illustrating a conventional stack package using through-silicon vias.

Referring to FIG. 2, in a stack package 200 using through-silicon vias, semiconductor chips 210, which are formed therein with through-silicon vias 230, are stacked on a substrate 220 such that the corresponding through-silicon vias 230 are connected to each other.

In FIG. 2, the unexplained reference numeral 212 designates bonding pads, 222 connection pads, 224 ball lands, 226 circuit wirings, and 270 outside connection terminals.

In the stack package using through-silicon vias, since electrical connections are formed through the through-silicon vias, degradation of the electrical characteristics of the semiconductor chips is prevented, the operating speed of the semiconductor chips is increased, and miniaturization is enabled.

However, in the conventional stack package using through-silicon vias, the through-silicon vias must be formed to pass through the semiconductor chips, and a circuit cannot be formed in the portions of the semiconductor chips where the through-silicon vias are formed. Therefore, the complicated nature of the manufacturing process increases the processing costs, and since it is necessary to fabricate wafers by designing semiconductor chips contemplating the through-silicon vias, wafers including widely used semiconductor chips cannot be used.

SUMMARY OF THE INVENTION

An embodiment of the present invention is directed to a molded reconfigured wafer which simplifies the manufacturing process, a stack package using the same, and a method for manufacturing the stack package.

Another embodiment of the present invention is directed to a molded reconfigured wafer which decreases the manufacturing cost, a stack package using the same, and a method for manufacturing the stack package.

In one aspect, a molded reconfigured wafer comprises a molding part formed to surround the side surfaces and lower surfaces of semiconductor chips each having a plurality of bonding pads on the upper surface thereof; through-electrodes formed in the molding part on both sides of the respective semiconductor chips; and re-distributionre-distribution lines formed to connect the through-electrodes and adjacent bonding pads to each other.

Each through-electrode is formed to have a depth which is deeper than the lower surface of each semiconductor chip.

The through-electrodes and the re-distributionre-distribution lines are formed so as to be integrated with each other.

In another aspect, a stack package includes at least two stack package units, each package unit comprising semiconductor chips having bonding pads on upper surfaces thereof; a molding part formed to surround the side surfaces of the semiconductor chips; through-electrodes formed in the molding part; and re-distributionre-distribution lines formed to connect the through-electrodes and adjacent bonding pads to each other.

A lower surface of each through-electrode projects out of the lower surface of the package unit.

The through-electrodes and the re-distributionre-distribution lines are formed so as to be integrated with each other.

The respective stack package units each have semiconductor chips of differing sizes.

The respective stack package units having the semiconductor chips of differing sizes have the same size overall.

The stack package further includes a substrate on which the stack package units are attached; and outside connection terminals attached to the lower surface of the substrate.

The stack package further includes a filler material interposed between the stack package units and between the lowermost stack package unit and the substrate.

The stack package further includes a capping layer formed on the upper surface of the uppermost package unit.

The stack package further includes an encapsulant formed to fill between the stack package units and between the lowermost package unit and the substrate and to cover the upper surface of the substrate including the upper surface of an uppermost package unit.

The stack package units are stacked on the substrate in a face-down manner.

The stack package further includes a semiconductor chip stacked on the uppermost package unit and not having through-electrodes and re-distributionre-distribution lines.

The bonding pad of the semiconductor chip not having through-electrodes and re-distributionre-distribution lines is realigned to correspond to the through-electrodes of the uppermost package unit.

In still another aspect, a method for manufacturing a stack package comprises the steps of defining grooves in portions of the molding part of each of a plurality of molded reconfigured wafers, the portions being adjacent to bonding pads of a plurality of semiconductor chips, each molded reconfigured wafer having the plurality of semiconductor chips which are provided with the bonding pads on upper surfaces thereof and the molding part which is formed to surround the side surfaces and lower surfaces of the semiconductor chips; forming through-electrodes in the grooves and forming re-distributionre-distribution lines which connect the adjacent through-electrodes and bonding pads to each other; removing the lower surfaces of the molded reconfigured wafers to expose the lower surfaces of the through-electrodes to thereby construct a plurality of package units; stacking the package units such that corresponding through-electrodes are connected to each other; and sawing the package units stacked at the wafer level at the chip level.

Each groove is defined to have a depth which is deeper than the lower surface of each semiconductor chip.

The step of forming the through-electrodes and the re-distributionre-distribution lines comprises the steps of forming a metal seed layer on the upper surface of the molded reconfigured wafer including the grooves; forming a metal layer on the metal seed layer to fill the grooves; and patterning the metal layer and the metal seed layer.

After the step of forming the metal layer and before the step of patterning the metal layer and the metal seed layer, the method further comprises the step of etching back the metal layer to reduce the thickness of the metal layer.

Removal of the lower surfaces of the molded reconfigured wafers is conducted using at least one of a grinding process and an etching process such that the molding parts are removed on the lower surfaces of the molded reconfigured wafers.

After the step of stacking the package units, the method further comprises the step of interposing a filler material between the stack package units and forming a capping layer on the uppermost package unit.

The stack package units have their respective semiconductor chips each of differing sizes.

After the step of sawing the package units at the chip level, the method further comprises the step of attaching the stack package units formed with the through-electrodes, to the substrate.

The method further comprises the step of interposing a filler material between the lowermost package unit attached to the substrate and the substrate.

After the step of attaching the stack package units to the substrate, the method further comprises the step of forming an encapsulant to fill between the stack package units and between the lowermost package unit and the substrate and to cover the upper surface of the substrate including the upper surface of the uppermost package unit.

After the step of attaching the stack package units to the substrate, the method further comprises the step of attaching outside connection terminals to the lower surface of the substrate.

DESCRIPTION OF SPECIFIC EMBODIMENTS

In the present invention, a molded reconfigured wafer is manufactured in a manner such that the molding part is formed to surround the side surfaces and the lower surfaces of semiconductor chips which have bonding pads provided thereon, through-electrodes are formed in the side molding portions of the molding part, and re-distributionre-distribution lines connect the through-electrodes and the bonding pads to each other. A stack package is realized using molded reconfigured wafers.

In detail, a molded reconfigured wafer includes generally good-quality semiconductor chips which are located at regular intervals and have bonding pads provided thereon, a molding part which is formed to surround the side surfaces and the lower surfaces of the respective semiconductor chips, through-electrodes which are formed in the side molding portions of the molding part, and re-distributionre-distribution lines which connect the through-electrodes and the bonding pads of the semiconductor chips to each other. In the present invention, at least two molded reconfigured wafers are stacked upon each other by way of the through-electrodes and are then divided at the chip level, thereby forming a stack package.

As a consequence, in the present invention, the molded reconfigured wafers, which have the through-electrodes formed in the molding parts thereof, are stacked such that the through-electrodes of the respective wafers are electrically connected. It is therefore unnecessary to fabricate wafers by designing semiconductor chips in consideration of through-electrodes to form a stack package, and widely used semiconductor chips can be adequately employed. The manufacturing process is therefore simplified while manufacturing costs are decreased.

Further, in the present invention, since the the stack package is formed using the molded reconfigured wafers which employ only good-quality semiconductor chips, the possibility of the entire stack package being rejected due to one defective semiconductor chip is eliminated, thereby preventing a decrease in yield.

Hereafter, a molded reconfigured wafer, a stack package using the same, and a method for manufacturing the stack package according to embodiments of the present invention will be described in detail.

Figure 1:
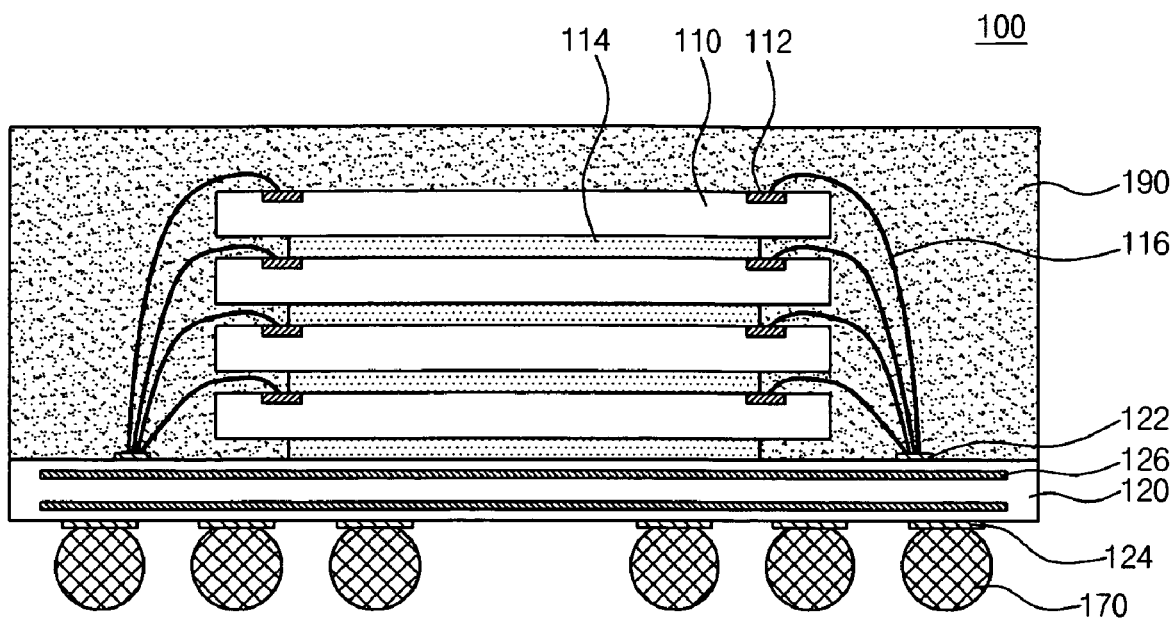
FIG. 1 is a cross-sectional view illustrating a conventional stack package using metal wires.
Figure 2:
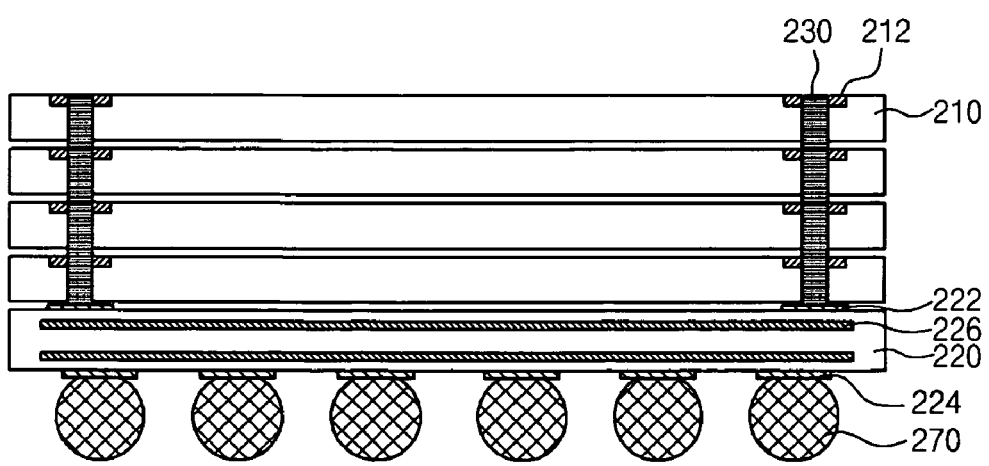
FIG. 2 is a cross-sectional view illustrating a conventional stack package using through-silicon vias.
Figure 3A:
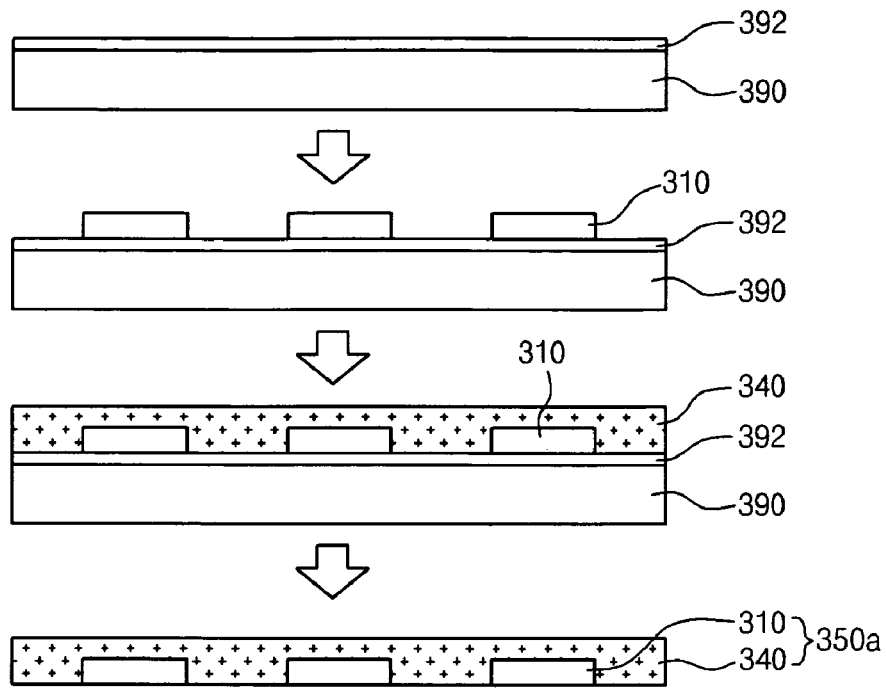
FIGS. 3A and 3B are a view and a photograph explaining a conventional molded reconfigured wafer.
Figure 3B:
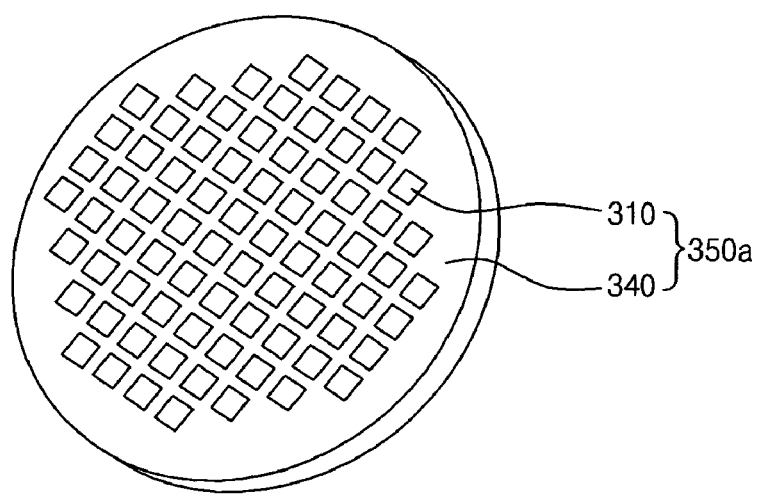
Figure 4:
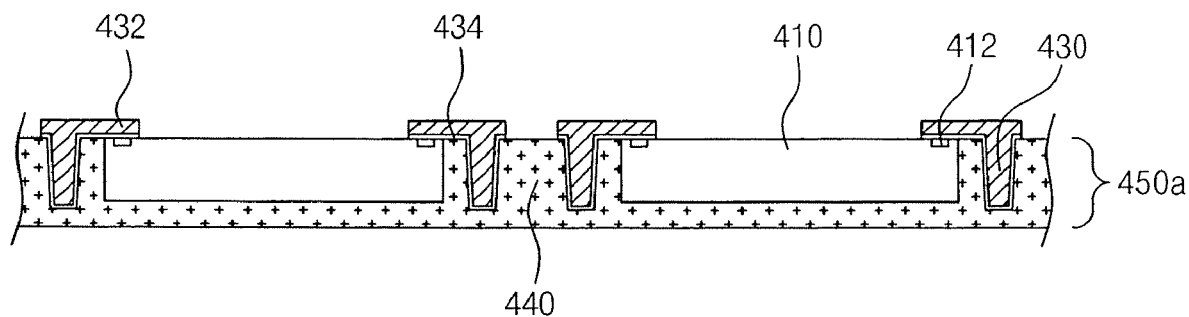
FIG. 4 is a cross-sectional view illustrating a molded reconfigured wafer in accordance with a first embodiment of the present invention.

FIGS. 3A and 3B are a view and a photograph explaining a conventional molded reconfigured wafer, and FIG. 4 is a cross-sectional view illustrating a molded reconfigured wafer in accordance with a first embodiment of the present invention.

Referring to FIGS. 3A and 3B, a conventional molded reconfigured wafer 350a is formed in a manner such that a plurality of good-quality semiconductor chips 310 are located at desired positions on a carrier 390, the upper surface of which a double-sided adhesive tape 392 is attached, a molding part 340 is formed on the double-sided adhesive tape 392 to surround the semiconductor chips 310, and then, the carrier 390 and the double-sided adhesive tape 392 are removed.

In other words, the molded reconfigured wafer is manufactured using a technology wherein good-quality semiconductor chips are separated from a wafer having undergone a chip manufacturing process and are located on a carrier, and then a new wafer is manufactured by conducting a molding process. A method for manufacturing a molded reconfigured wafer is disclosed in M. Brunnbauer et al., "An Embedded Device Technology Based on a Molded Reconfigured Wafer", ECTC, 2006, pp. 547~551.

The present invention is constructed to realize a stack package by forming through-electrodes and re-distribution lines in the conventional molded reconfigured wafer.

Referring to FIG. 4, in a molded reconfigured wafer 450a according to the present invention, through-electrodes 430 are formed in a molding part 440 adjacent to bonding pads 412 provided on the respective semiconductor chips 410 of a conventional molded reconfigured wafer, such that the through-electrodes 430 have a depth deeper than the lower surfaces of the semiconductor chips 410 but which does not pass through the molding part 440. Further, re-distribution lines 432 are formed to electrically connect the bonding pads 412 and adjacent through-electrodes 430 with each other.

The through-electrodes 430 and the re-distribution lines 432 are preferably integrally formed with each other by depositing a metal layer on the metal seed layer 434 and patterning them. The through-electrodes 430, the re-distribution lines 432 and the metal seed layer 434 are made of at least one of Sn, Ni, Cu, Au and Al or a combination thereof.

Hereafter, a stack package using the molded reconfigured wafer according to the present invention will be described below.

Figure 5:
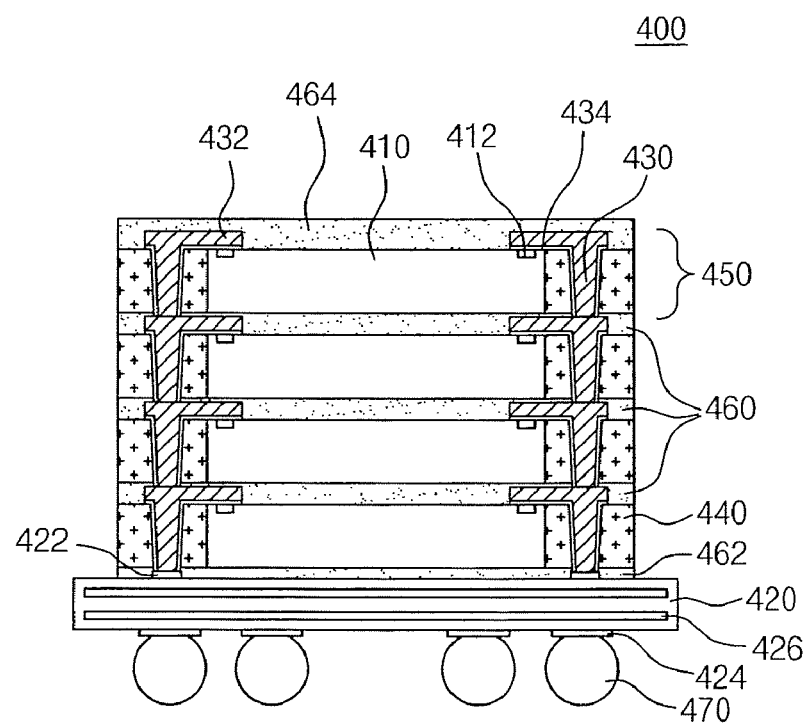
FIG. 5 is a cross-sectional view illustrating a stack package in accordance with a second embodiment of the present invention.

FIG. 5 is a cross-sectional view illustrating a stack package in accordance with a second embodiment of the present invention.

Referring to FIG. 5, a stack package 400 according to the present invention is formed in a manner such that at least two package units 450, which are formed using molded reconfigured wafers 450a having through-electrodes 430 and re-distribution lines 432, are stacked upon each other.

Each package unit 450 includes a semiconductor chip 410 which is provided with bonding pads 412 on both sides of an upper surface thereof, a molding part 440 which is formed to surround the side surfaces of the semiconductor chip 410, through-electrodes 430 which are formed in the molding part 440 adjacent to the bonding pads 412, and re-distribution lines 432 which electrically connect the bonding pads 412 and adjacent through-electrodes 430 with each other.

In order to ensure easy formation of the stack package 400, the through-electrodes 430 project out of the lower surfaces of the package units 450, and corresponding through-electrodes 430 of the stack package units 450 are connected with each other.

In order to electrically connect the stack package units 450 with the outside, the stack package units 450 are mounted to a substrate 420. The substrate 420 has a plurality of connection pads 422 on the upper surface thereof, ball lands 424 on the lower surface thereof, to which outside connection terminals 470 are attached, and circuit wirings 426 inside thereof. The through-electrodes 430 of the lowermost package unit 450 are electrically connected with the connection pads 422 of the substrate 420.

A first filler material 460, a second filler material 462 and a capping layer 464 are respectively formed between the stack package units 450, between the lowermost package unit 450 and the substrate 420, and on the upper surface of the uppermost package unit 450 so as to ensure electrical insulation and protection of the semiconductor chips 410.

As described above, by forming the stack package according to the present invention using the molded reconfigured wafers which are formed with the through-electrodes in the molding parts thereof, when forming a stack package at a wafer level, since it is possible to prevent good-quality semiconductor chips from being made useless due to the presence of a defective chip, the manufacture yield is increased. Also, since a stack package can be realized using widely used semiconductor chips, the manufacturing process is simplified and manufacturing costs are decreased.

FIGS. 6A through 6F are cross-sectional views illustrating processes of a method for manufacturing the stack package in accordance with the second embodiment of the present invention.

Figure 6A:
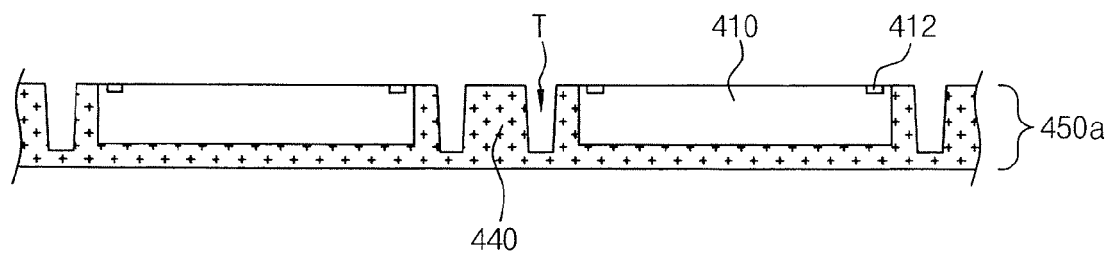
FIGS. 6A through 6F are cross-sectional views illustrating processes of a method for manufacturing the stack package in accordance with the second embodiment of the present invention.

Referring to FIG. 6A, the molded reconfigured wafer 450a, which includes the semiconductor chips 410 provided with the plurality of bonding pads 412 on the upper surfaces thereof and the molding part 440 formed to surround the side surfaces and the lower surfaces of the semiconductor chips 410, is prepared. Then, grooves T are defined in portions of the molding part 440 of the molded reconfigured wafer 450a, which are adjacent to the respective bonding pads 412, such that the grooves T have a depth which is deeper than the semiconductor chips 410 but does not pass through the molding part 440.

Figure 6B:
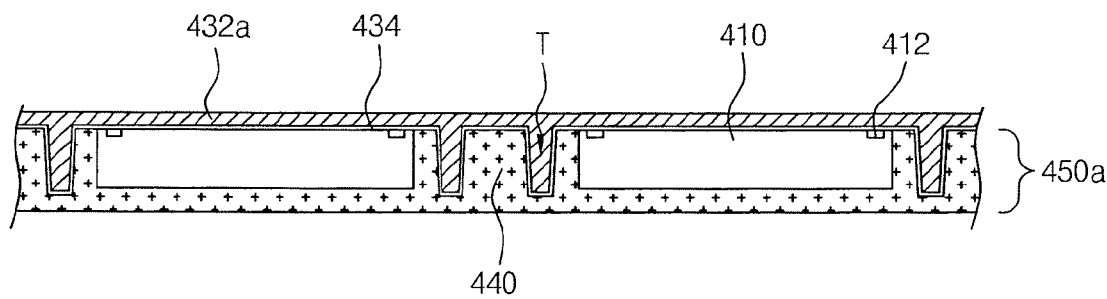

Referring to FIG. 6B, after the metal seed layer 434 is formed on the molded reconfigured wafer 450a including the surfaces of the grooves T, through conducting a plating process for the resultant molded reconfigured wafer 450a, a metal layer 432a is formed on the metal seed layer 434 to fill the grooves T. The metal seed layer 434 and the metal layer 432a are made of at least one of Sn, Ni, Cu, Au and Al or a combination thereof. The metal layer 432a may be etched by a predetermined thickness through an etch-back process so as to reduce the overall height of the resultant stack package.

Figure 6C:
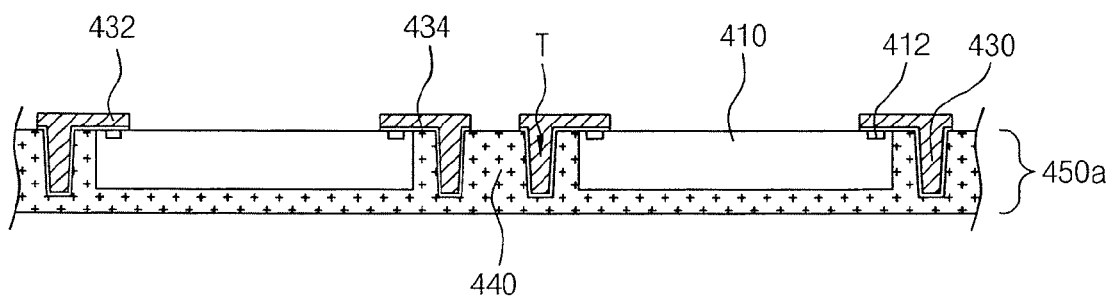

Referring to FIG. 6C, by patterning the metal layer 432a and the metal seed layer 434 formed on the molded reconfigured wafer 450a, the through-electrodes 430 and the re-distribution lines 432 for electrically connecting the bonding pads 412 of the semiconductor chips 410 and adjacent through-electrodes 430 to each other are formed in the molded reconfigured wafer 450a. The metal layer is etched through a wet etching process.

Figure 6D:
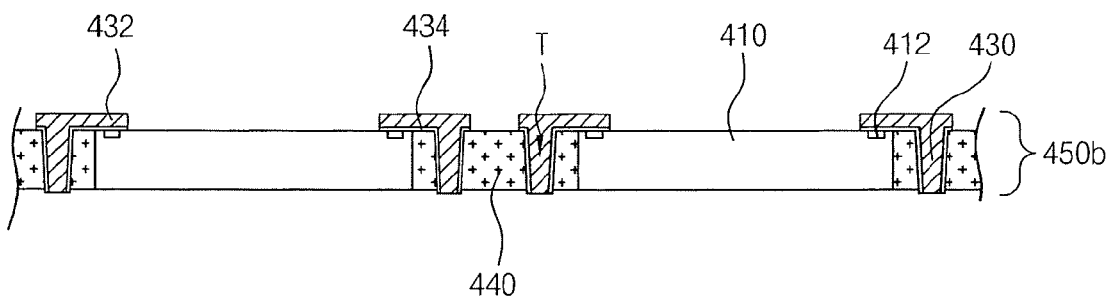

Referring to FIG. 6D, by removing the lower portion of the molded reconfigured wafer 450a by conducting at least one of a grinding process and an etching process, the lower portions of the through-electrodes 430 are exposed to the outside. A molded reconfigured wafer 450b including the plurality of package units 450 is therefore formed. Preferably, the removal of the lower portion of the molded reconfigured wafer 450a is implemented in a manner such that the lower portions of the through-electrodes 430 project out of the molding part 440 of the molded reconfigured wafer 450b so as to ensure a stable electrical connection when forming the stack package.

Figure 6E:
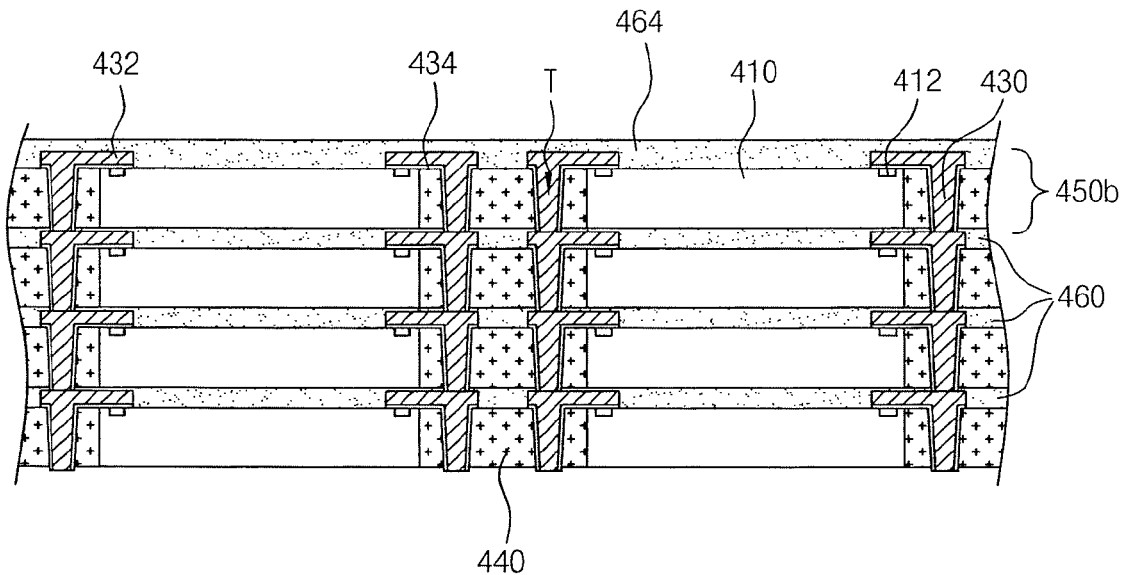

Referring to FIG. 6E, at least two molded reconfigured wafers 450b including the plurality of package units 450 are stacked such that corresponding through-electrodes 430, which are formed in the package units 450 of the respective molded reconfigured wafers 450b, are connected to each other. Next, the first filler material 460 and the capping layer 464 are respectively formed between the stacked molded reconfigured wafers 450b and on the uppermost molded reconfigured wafer 450b so as to ensure electrical insulation and protection of the semiconductor chips 410.

Figure 6F:
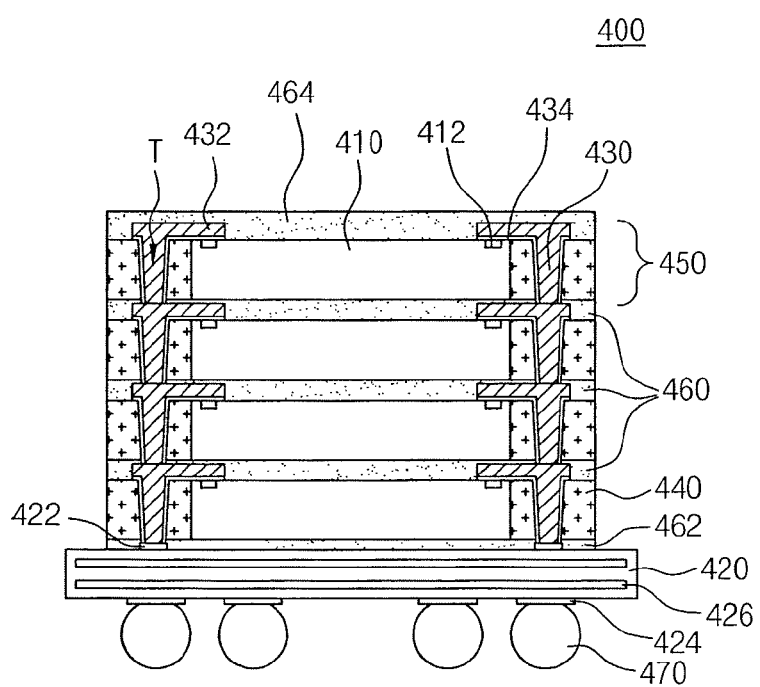

Referring to FIG. 6F, by sawing the molded reconfigured wafers 450b stacked at the wafer level at the chip level, structures, in each of which the package units 450 are stacked upon one another, are obtained. Thereupon, the stack package units 450 are mounted on the substrate 420, having the plurality of connection pads 422 on the upper surface thereof, the ball lands 424 on the lower surface thereof and the circuit wirings 426 inside thereof. Then, the outside connection terminals 470 are attached to the ball lands 424. At this time, the through-electrodes 430 of the lowermost package unit 450 of the stack package units 450 are attached in correspondence with the connection pads 422 of the substrate 420. The second filler material 462 is interposed between the lowermost package unit 450 and the substrate 420 to improve the reliability of the joint.

Figure 7:
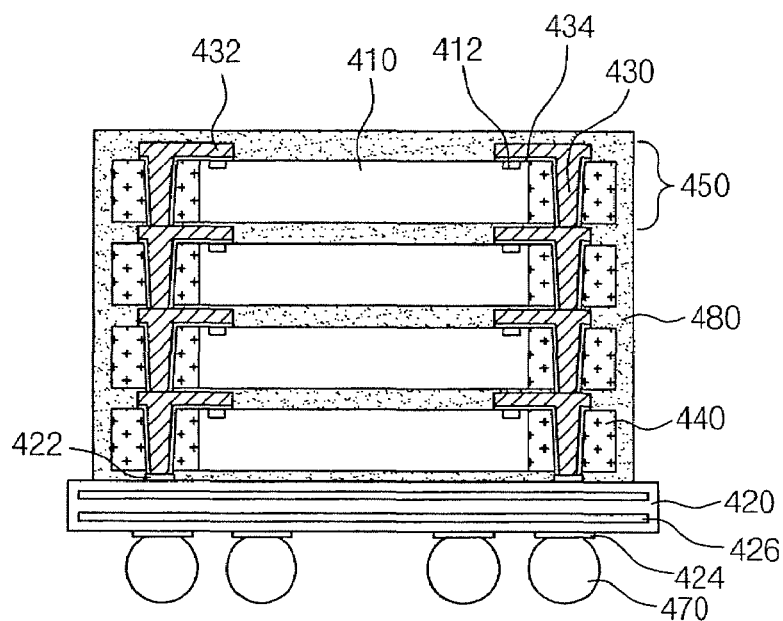
FIG. 7 is a cross-sectional view illustrating a stack package in accordance with a third embodiment of the present invention.

FIG. 7 is a cross-sectional view illustrating a stack package in accordance with a third embodiment of the present invention.

Referring to FIG. 7, in a stack package 400 according to the present embodiment, while the package units 450 are stacked in the same manner as in FIG. 5, in place of the first filler material 460, the second filler material 462 and the capping layer 464, an encapsulant 480 is interposed between at least two stack package units 450 and between the lowermost package unit 450 and the substrate 420 and to cover the upper surface of the substrate 420 including the upper surface of the uppermost package unit 450.

In this stack package, the stack package units 450 are stacked in the same manner as shown in FIGS. 6A through 6E until before the first filler material 460 and the capping layer 464 are formed, and then, after the stack package units 450 are attached to the substrate 420, in order to ensure electrical insulation and to improve the reliability of the joint, the encapsulant 480 is formed to fill between at least two stack package units 450 and between the lowermost package unit 450 and the substrate 420 and to cover the upper surface of the substrate 420 including the upper surface of the uppermost package unit 450.

Figure 8:
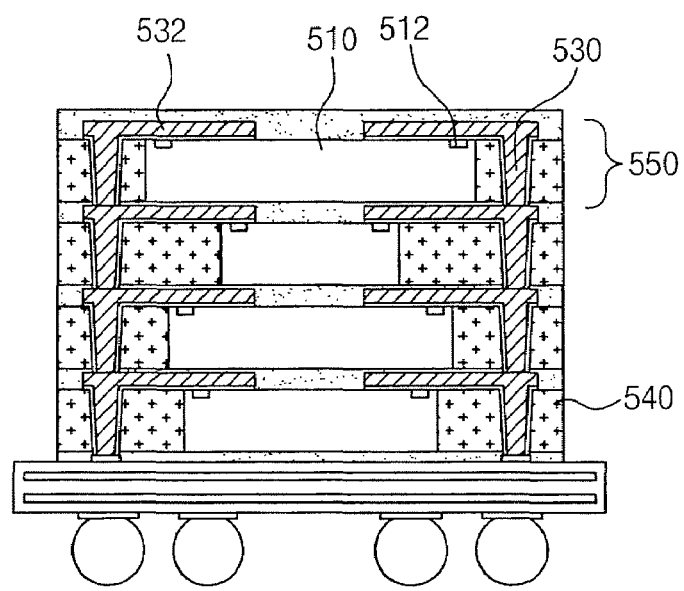
FIG. 8 is a cross-sectional view illustrating a stack package in accordance with a fourth embodiment of the present invention.

Meanwhile, referring to FIG. 8, a stack package 500 in accordance with a fourth embodiment of the present invention is configured such that package unit 550 having semiconductor chips 510 of differing sizes are stacked upon one another. The package units 550 are formed to have the same size. In detail, when the size of a semiconductor chip 510 constituting a package unit 550 is relatively small, by enlarging a molding part 540, the stack package units 550 can have an identical size.

Re-distribution lines 532 for connecting the bonding pads 412 provided to the respective package units 550 and through-electrodes 530 with each other are formed to have the same length. This is to ensure that, even though the package units 550 are formed using the semiconductor chips 510 of different sizes, the re-distribution lines 532 can be simply formed through a patterning process using the same mask pattern. The length of the re-distribution lines 532 is determined based on the semiconductor chip 510 having the smallest size.

The remaining configuration of the stack package 500 excluding the re-distribution lines 532 and the semiconductor chips 510 is the same as shown in FIG. 5, and a manufacturing method thereof is the same as shown in FIGS. 6A through 6F.

Figure 9:
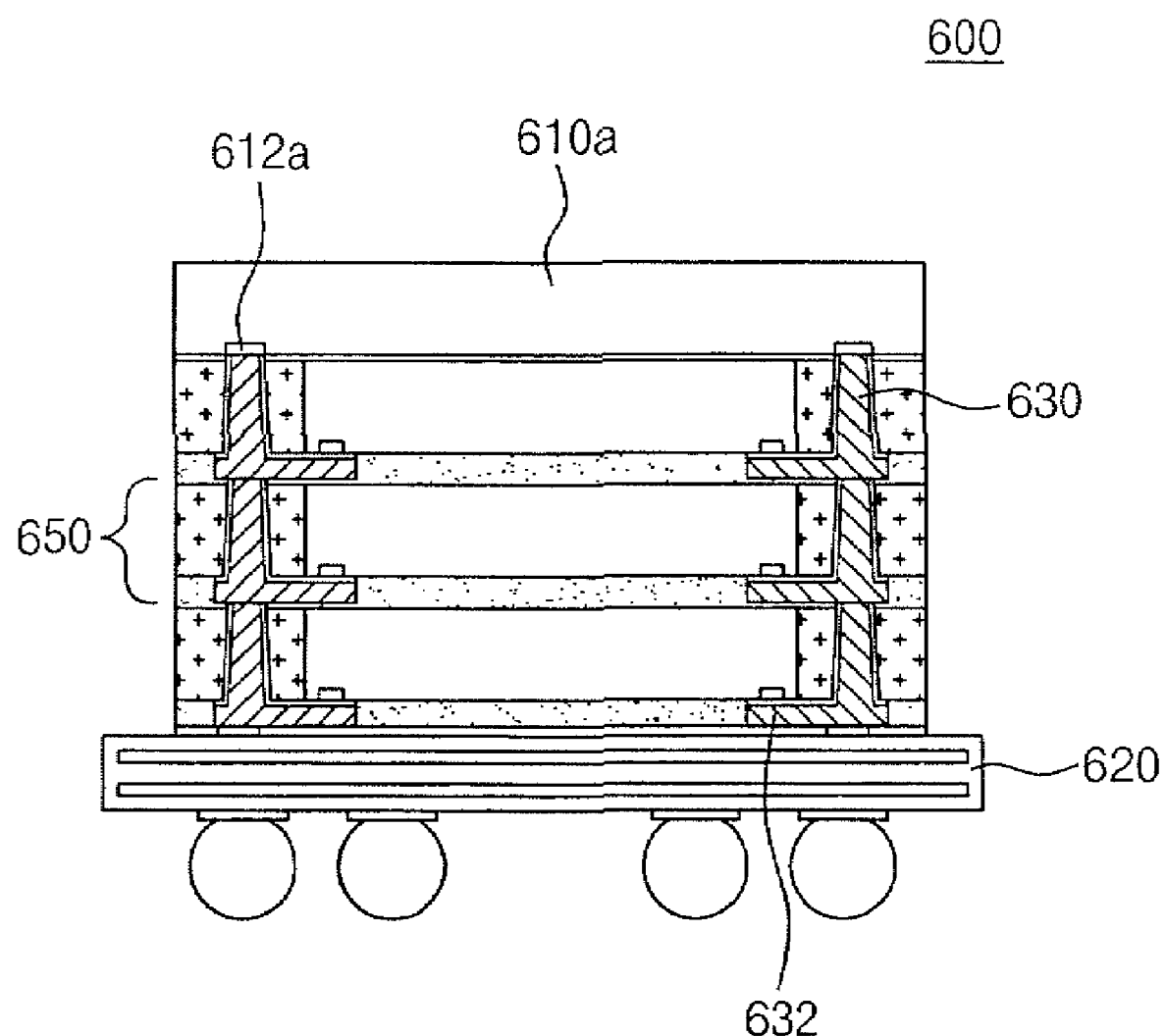
FIG. 9 is a cross-sectional view illustrating a stack package in accordance with a fifth embodiment of the present invention.

Further, referring to FIG. 9, in a stack package 600 in accordance with a fifth embodiment of the present invention, while package units 650 having the same construction as shown in FIG. 5 are stacked on a substrate 620, the package units 650 are stacked such that the upper surfaces of the package units 650 face the substrate 620 and re-distribution lines 632, which are formed on the upper surface of the package unit 650, are attached to the substrate 620. Further, through-electrodes 630 and re-distribution lines 632 are not formed on the uppermost package unit 650, and instead, a generally structured semiconductor chip 610a, which has re-routed bonding pads 612a in place of the through-electrodes, is located uppermost.

The configuration of the package units 650 constituting the stack package 600 is the same as shown in FIG. 5, and a method for manufacturing the package unit 650 is the same as shown in FIGS. 6A through 6F.

Further, while not shown in the drawings, in the present invention, a stack package can be constructed in a manner such that, although package units are stacked to have the same structures as the above-described stack packages, without using substrates to form electrical connections, a rearrangement layer is formed on the lower surface of a lowermost stack package unit and outside connection terminals are attached to the rearrangement layer.

As is apparent from the above description, the present invention provides advantages in that, since a stack package is realized using molded reconfigured wafers each having a molding part surrounding the semiconductor chips and in which through-electrodes are formed, it is not necessary to fabricate wafers by designing semiconductor chips in consideration of through-electrodes to form a stack package, and widely used semiconductor chips can be adequately employed, whereby the manufacturing process is simplified and manufacturing costs are decreased. Further, in the present invention, due to the fact that the stack package is formed using the molded reconfigured wafers which employ only good-quality semiconductor chips, the possibility of the entire stack package being rejected due to one defective semiconductor chip is eliminated, and it is possible to prevent a decrease in the manufacturing yield.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A molded reconfigured wafer comprising:
    a molding part formed to surround the side surfaces and lower surfaces of semiconductor chips, each having a plurality of bonding pads on an upper surface thereof;
    a plurality of through-electrodes passing through an upper face of the molding part and a lower face opposite to the upper face, wherein the plurality of through electrodes are adjacently disposed to the bonding pads of the semiconductor chip; and
    a plurality of re-distribution lines formed to connect the through-electrodes and the adjacent bonding pads to each other.

2. The molded reconfigured wafer according to claim 1, wherein each through-electrode in the mold part is formed to have a bottom depth which is deeper than the lower surface of each semiconductor chip in the mold part.

3. The molded reconfigured wafer according to claim 1, wherein the through-electrodes and the re-distribution lines are formed integrally.

4. A stack package including at least two stacked package units, each package unit comprising:
    semiconductor chips, each having lower and upper surfaces such that bonding pads are formed on the upper surface of each semiconductor chip;
    a molding part formed to surround the side surfaces of each semiconductor chip;
    a plurality of through-electrodes passing through an upper face of the molding part and a lower face opposite to the upper face, wherein the plurality of through-electrodes are adjacently disposed to the bonding pads of the semiconductor chip; and
    re-distribution lines formed to connect the through-electrodes and the adjacent bonding pads to each other.

5. The stack package according to claim 4, wherein a lower surface of each through-electrode in the mold part projects out of the lower surface of the package unit.

6. The stack package according to claim 4, wherein the through-electrodes and the re-distribution lines are formed integrally.

7. The stack package according to claim 4, wherein at least one of the semiconductor chips is of different size.

8. The stack package according to claim 7, wherein the at least two stacked package units are of the same size regardless of the size differences of the semiconductor chips packaged therein.

9. The stack package according to claim 4, further comprising:
    a substrate to which the at least two stacked package units are attached over an upper surface of the substrate; and
    outside connection terminals attached to a lower surface of the substrate.

10. The stack package according to claim 9, further comprising:
    a filler material interposed between the stacked package units and between a lowermost package unit and the substrate.

11. The stack package according to claim 9, further comprising:
    a capping layer formed on an upper surface of an uppermost package unit.

12. The stack package according to claim 9, further comprising:
    an encapsulant formed to fill between the stacked package units and between a lowermost package unit and the substrate and to cover an upper surface of the substrate including an upper surface of an uppermost package unit.

13. The stack package according to claim 9, wherein the stacked package units are stacked on the substrate in a face-down manner.

14. The stack package according to claim 13, further comprising:
    a semiconductor chip stacked on the uppermost package unit, wherein the stacked semiconductor chip does not have through-electrodes and re-distribution lines.

15. The stack package according to claim 14, wherein the bonding pad of the semiconductor chip not having the through-electrodes and the re-distribution lines is realigned to correspond to the through-electrodes of the uppermost package unit.

* * * * *